United States Patent [19]

Blake et al.

[11] Patent Number: 5,204,990

[45] Date of Patent: Apr. 20, 1993

[54] MEMORY CELL WITH CAPACITANCE FOR SINGLE EVENT UPSET PROTECTION

[75] Inventors: Terence G. W. Blake, Dallas; Theodore W. Houston, Richardson, both of Tex.

[73] Assignee: Texas Instruments Incorporated, Dallas, Tex.

[21] Appl. No.: 241,516

[22] Filed: Sep. 7, 1988

[51] Int. Cl.$^5$ .............................................. H01K 27/02
[52] U.S. Cl. .................................... 257/904; 257/300; 257/379; 365/154
[58] Field of Search ................. 357/51, 42, 67 S, 23.6, 357/59 F; 355/154, 155, 156, 190

[56] References Cited

U.S. PATENT DOCUMENTS

| | | | |
|---|---|---|---|
| 4,453,175 | 6/1984 | Ariizumi et al. | 357/51 |
| 4,481,524 | 11/1984 | Tsujida | 357/51 |
| 4,614,881 | 9/1986 | Yoshida et al. | 307/219 |
| 4,725,981 | 2/1988 | Rutledge | 365/154 |
| 4,745,454 | 5/1988 | Erb | 357/23.6 |
| 4,827,448 | 5/1989 | Kuo | 357/51 |
| 4,833,644 | 5/1989 | Plus et al. | 355/154 |
| 4,912,675 | 3/1990 | Blake et al. | 365/154 |

FOREIGN PATENT DOCUMENTS

| | | | |
|---|---|---|---|
| 56-083073 | 7/1981 | Japan | 357/67 |
| 61-208698 | 9/1986 | Japan | 355/156 |
| 1163788 | 12/1986 | United Kingdom | 365/154 |

OTHER PUBLICATIONS

"An Seu Tolerant Memorycell from Fundamental Studies of Seu Mechanisme In Srams"]IEEE Transactions on Nuclear Science, vol. 34, No. 6, part 1, Dec. 1987, pp. 1281-1286—New York, H. Weaver et al.

"Logic-Family & Memory-Cell Designs Providing abrupt Voltage Transitions & High Noise Margins" Proceedings of the 1987 Bipolar Circuits & Technology Meeting.

"DMSP Dosimetry Data: A Space Measurement and Mapping of Upset Causing Phenomena", E. G. Gussenhower, et al., IEEE Trans. Nuclear Science, vol. NS-34, pp. 1251-1255 (1987).

"AN SEU Tolerant Memory Cell Derived from Fundamental Studies of SEU Mechanisms in SRAM", H. T. Weaver, et al., IEEE Trans. Nuclear Science, vol. NS-34, pp. 1281-1286 (1987).

"Alpha Particle Induced Soft Errors in Dynamic Memories", T. C. May, et al., IEEE Trans, Electronic Devices, vol. ED-26, p. 2 (1979).

Primary Examiner—Rolf Hille
Assistant Examiner—Minhloan Tran
Attorney, Agent, or Firm—Stanton C. Braden; Richard L. Donaldson; Jay Cantor

[57] ABSTRACT

A compact capacitor for use in a small memory cell in high density memories is disclosed. Such a capacitor in the cross-coupling of cross-coupled inverters in the memory cell improves single event upset hardness. The subject capacitor in its preferred embodiment is a MOS capacitor with both n+ and p+ connections to the capacitor channel so as to maintain a relatively high capacitance for both positive and negative capacitor gate voltages.

12 Claims, 8 Drawing Sheets

MEMORY CELL WITH CAPACITANCE FOR SINGLE EVENT UPSET PROTECTION

FIELD OF THE INVENTION

This invention is in the field of integrated circuits and is specifically directed to static random access memories.

This invention was made with Government support under contract number DNA 001-86-C-0090S-408 awarded by the Defense Nuclear Agency. The Government has certain rights in this invention.

BACKGROUND OF THE INVENTION

Figure 1A:
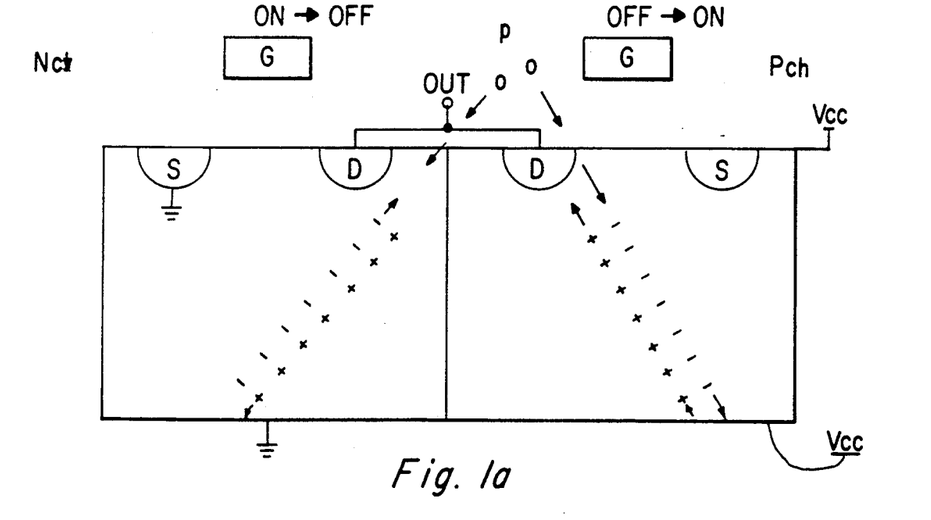
FIG. 1a is a cross-sectional view of a CMOS inverter.

Static memory cells in certain environments in which radiation is present such as communication satellite orbital space are, or will likely be particularly susceptible to soft errors or single event upsets (SEUs). See E. G. Muller, M. S. Gussenhower, K. A. Lynch and D. H. Brenteger, "DMSP Dosimetry Data: A Space Measurement and Mapping of Upset Causing Phenomena". IEEE Trans. Nuclear Science NS-34, pp. 1251-1255 (1987) and H. T. Weaver, et al., "An SEU Tolerant Memory Cell Derived from Fundamental Studies of SEU Mechanisms in SRAM", IEEE Trans. Nuclear Science, NS-34, pp. 1281-1286 (1987). A soft error or single event upset (SEU) is typically caused by electron-hole pairs created by, and along the path of, a single energetic particle as it passes through an integrated circuit, such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays. See T. C. May and M. H. Woods, "Alpha Particle Induced Soft Errors in Dynamic Memories, IEEE Trans. Electronic Devices, ED-26, p. 2 (1979) and J. C. Pickel, J. T. Blaudfood, Jr., "CMOS RAM Cosmic Ray - Induced Error Rate Analysis", IEEE Trans. on Nuclear Science, Vol. NS-28, pp. 3962-3967 (1981). Alternatively, the critical charge may result from alpha particles (helium nuclei). One example of SEU can be seen in FIG. 1a which illustrates a cross-sectional view of a CMOS inverter. When alpha particle p strikes bulk semiconductor material in p-channel MOS transistor Pch it generates electron-hole pairs as shown by the respective minus and plus marks. Assuming that n-channel transistor Nch is on and that p-channel transistor Pch is off, the holes which collect (see arrows toward drain D) at drain D can change the voltage at output OUT from a logic low to a logic high. The electrons as indicated by the minus signs will diffuse toward circuit supply voltage Vcc. A charge generating energetic particle hit on transistor Nch has the opposite effect with positive charges drifting towards ground and negative charges collecting at output OUT, thus possibly changing the logic state of the inverter.

Figure 1B:
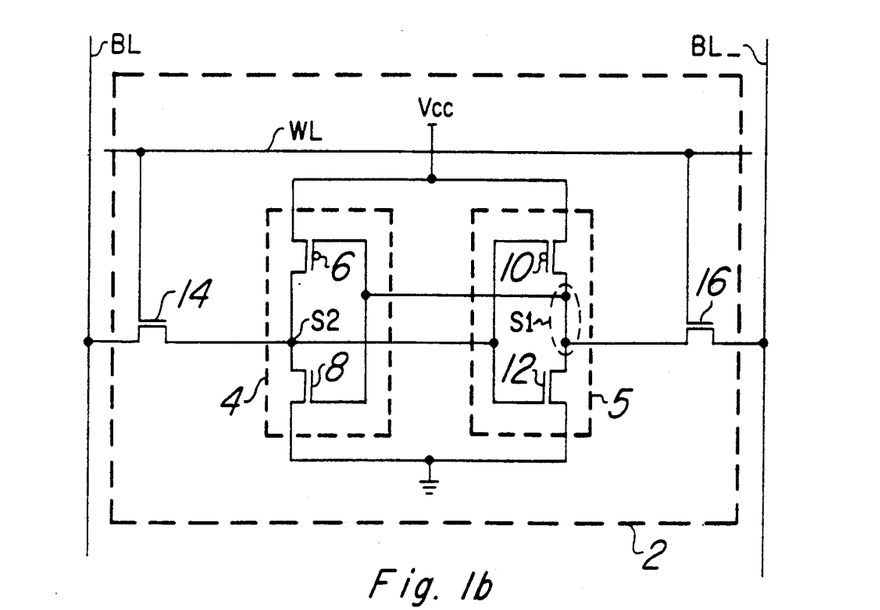
FIG. 1b is a schematic drawing of a conventional CMOS memory cell typically used in an SRAM.

Further background follows with reference to FIG. 1b which illustrates a schematic drawing of a conventional CMOS (complementary metal oxide semiconductor) static memory cell, typically used in a static random access memory (SRAM). Memory cell 2 is constructed according to well known methods of cross-coupled inverter realization and thus CMOS inverters are used in memory cell 2. (Note that the word metal used in the phrase metal oxide semiconductor is interpreted in semiconductor and related arts as also encompassing polycrystalline material). A first CMOS inverter 4 in memory cell 2 is made up of p-channel transistor 6 and n-channel transistor 8 having their source-to-drain paths connected in series between Vcc and ground, and having their gates tied together. The second CMOS inverter 5 in memory cell 2 is similarly constructed, with p-channel transistor 10 and n-channel transistor 12 having their source-to-drain paths connected in series between Vcc and ground and their gates also common. The cross-coupling is accomplished by the gates of transistors 6 and 8 being connected to the drains of transistors 10 and 12 (node S1 of FIG. 1b), and by the gates of transistors 10 and 12 being connected to the drains of transistors 6 and 8 (node S2 of FIG. 1b). N-channel pass transistor 14 has its source-to drain path connected between node S2 and a first bit line BL, and has its gate connected to word line WL. N-channel pass transistor 16 similarly has its source-to-drain path connected between node S1 and a second bit line BL_, and has its gate also connected to word line WL. Pass transistors 14, 16 when enabled, allow data to pass into and out memory cell 2 from bit lines BL and BL_ respectively. Bit lines BL and BL_ carry data into and out of memory cell 2. Pass transistors 14, 16 are enabled by word line WL which is a function of the row address in an SRAM. The row address is decoded by a row decoder in the SRAM such that one out of n word lines is enabled, where n is the number of rows of memory cells in the memory which is a function of memory density and architecture.

In operation, the voltages of node S1 and S2 will necessarily be logical complements of one another, due to the cross-coupled nature of CMOS inverters 4,5 within memory cell 2. When word line WL is energized by the row decoder (not shown), according to the row address received at address inputs to an address buffer (not shown) connected to the row decoder, pass transistors 14 and 16 will be turned on, coupling nodes S1 and S2 to bit lines BL_ and BL, respectively. Accordingly, when word line WL is high, the state of memory cell 2 can establish a differential voltage on BL and BL_. Alternatively, peripheral circuitry forcing a voltage on BL and BL_ can alter the state of memory cell 2. The sizes of the transistors shown in FIG. 1b are generally chosen such that when pass transistors 14 and 16 are turned on by word line WL; a differentially low voltage at bit line BL with respect to bit line BL_ can force node S2 to a logic low level; and a differentially low voltage at bit line BL_ with respect to bit line BL can force node S1 to a logic low level. However, the sizes of the transistors shown in FIG. 1 are also chosen such that when transistors 14 and 16 are on; a differentially high voltage at bit line BL with respect to bit line BL_ will not force node S2 high; nor will a differentially high voltage at bit line BL_ with respect to bit line BL force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

One method for hardening a memory cell against SEU is by reducing the amount of charge generated by a given event. This is accomplished for example, by using a silicon film thinner than the collection depth in bulk material. For instance, a memory cell created on a thin film of silicon, such as in a SOI (silicon on insulator) device is less susceptible to SEU than one created on bulk semiconductor such as silicon because ionization charge along a path in an insulator is more likely to recombine than be collected compared to ionization charge created in a semiconductor.

Figure 2:
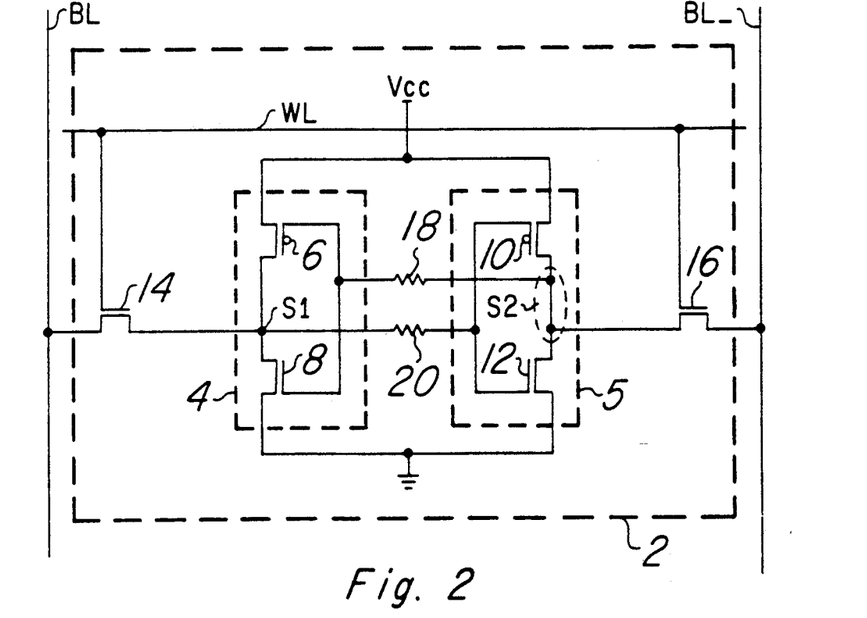
FIG. 2 is a schematic drawing of a prior art SEU hardening scheme based on increasing critical charge.

Another way to reduce the susceptibility of a memory cell to upset is by increasing the critical charge of the cell. A hardening scheme against SEU in static memory cells based on increasing the critical charge required to produce SEU is illustrated in the schematic drawing of FIG. 2. As shown, resistors 18 and 20 are included in the cross-coupling lines of inverters 4 and 5 and they increase the RC time constant delay associated with the gate capacitances of transistors 6, 8, 10, and 12. The initial effect of an energetic particle strike in a critical volume is to change the voltage of one node of the memory cell, say node S1. Upset will occur if this change in voltage propagates through the cross coupling of inverters 4 and 5 before the initial voltage of node S1 is restored. The increased RC delay slows the feedback propagation through the cross coupling and allows more time for recovery of the initially affected node. However, this increase in RC propagation delay also slows the write cycle time of cell 2. The write cycle of an SRAM has typically been faster than the read cycle so that some slowing of the write cycle has been acceptable, since the read cycle time was the most critical. However, with scaling of memory cells to small geometries, the speed of the write cycle of SEU hardened cells has become critical. Therefore, this resistive approach to SEU hardening is no longer desirable.

Figure 3:
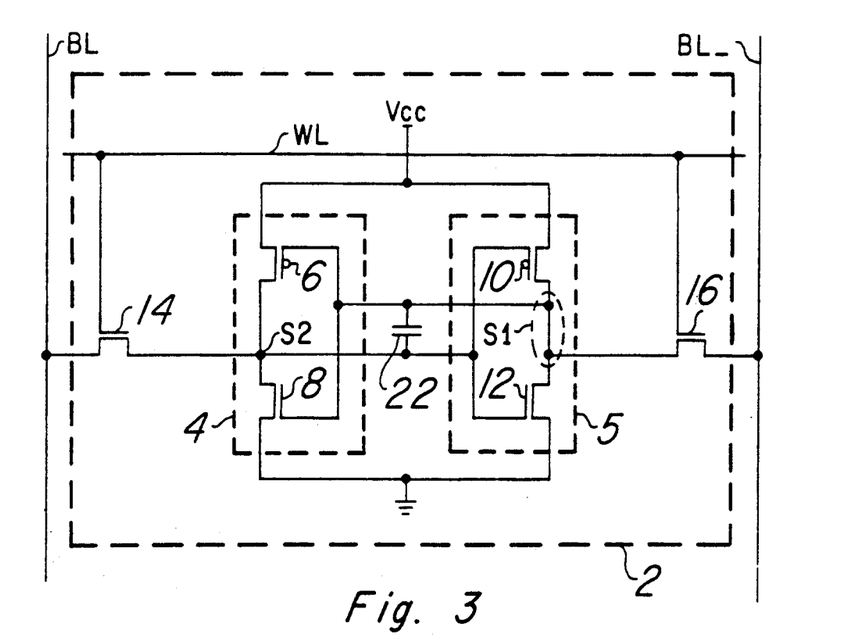
FIG. 3 is a schematic drawing of a SEU hardening scheme using capacitance in the inverter cross coupling.

Another hardening scheme against SEU based on increasing the critical charge is to increase the capacitance on the inverter drains, thus decreasing the voltage change on the node for a given amount of collected charge. The effectiveness of the capacitance in increasing the critical charge for SEU is increased by having the capacitance between the drains of the two inverters, which, with the cross coupling, is the same as between the gate and drain of the same inverter, as shown in FIG. 3. FIG. 3 illustrates the same circuit schematic as FIG. 1b with the exception that capacitor 22 is connected across the drains of inverters S1 and S2. By having the capacitance between the gate and drain of the inverter, the effect of the capacitance is increased by the Miller capacitance. Also, with the capacitance from gate to drain, a change in the drain voltage induces a change in the gate voltage such that the restoring current is increased. Increased capacitance on the gate will also increase the RC delay in the feed back path, thus increasing resistance to SEU and also slowing the write; however, so long as the resistance is small, this effect will be minimal.

OBJECTS OF THE INVENTION

It is an object of the invention to provide a new and improved memory cell.

It is another object of the invention to provide a new and improved memory cell for use in a static random access memory.

It is still another object of the invention to provide a new and improved memory cell having increase hardness against single event upset.

It is yet still another object of the invention to provide a compact capacitor in a memory cell for high density memories.

It is a further object of the invention to provide a compact capacitor in a memory cell which maintains a relatively high amount of capacitance for all capacitor gate voltages.

SUMMARY OF THE INVENTION

The foregoing objects of the invention are accomplished by a memory cell including cross-coupled inverters and having a MOS capacitor with both n+ semiconductor material and p+ semiconductor material connections to the capacitor channel, thereby allowing a high capacitance to be maintained for positive and negative capacitor gate voltages. The MOS capacitor is connected across the cross-coupling of the inverters to increase single event upset hardness.

Alternatively, dynamic memory (memory requiring refresh) can be substituted in place of the static memory and include the foregoing discussed MOS capacitor structure.

DETAILED DESCRIPTION OF THE INVENTION

Figure 4:
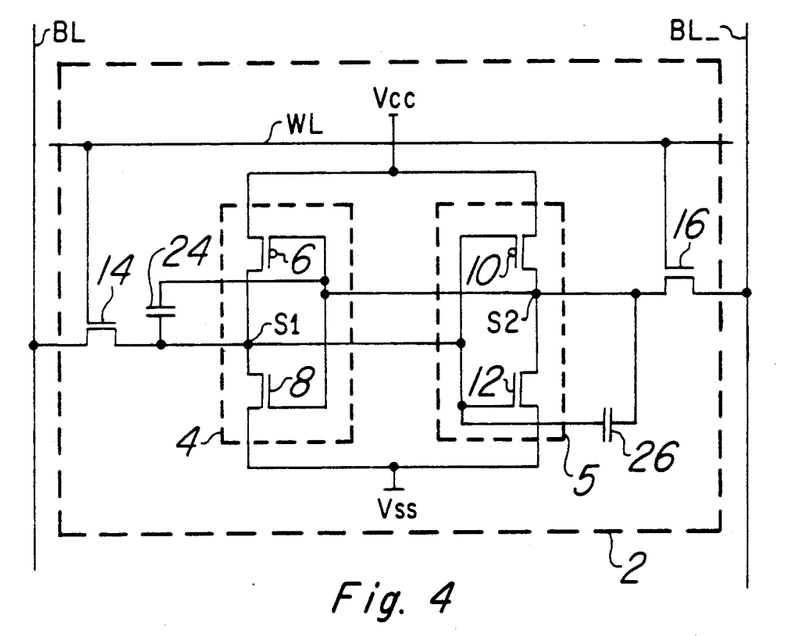
FIG. 4 is a schematic drawing of the SEU hardening scheme which embodies the invention.

A schematic drawing of an integrated circuit which embodies the invention is illustrated in FIG. 4. Note that for optimum SEU hardness that this circuit is built on an insulator (although it can be built on bulk semiconductor material) and therefore can be classified as an SOI device. FIG. 4 illustrates the same circuit schematic shown in FIG. 3 with the exception that capacitor 22 has been drawn in two parts: capacitor 24 and capacitor 26. Capacitor 24 is connected to and between the common drain and the the common gate of transistors 6 and 8; and capacitor 26 is connected to and between the common gate and the common drain of transistors 10 and 12. Additionally, Vss has been substituted for the ground node in FIG. 3 to indicate that a voltage in addition to circuit ground can be held by that node. Likewise as with the circuit shown in FIG. 3, this circuit does not negatively affect the write cycle time by a significant amount.

Figure 5A:
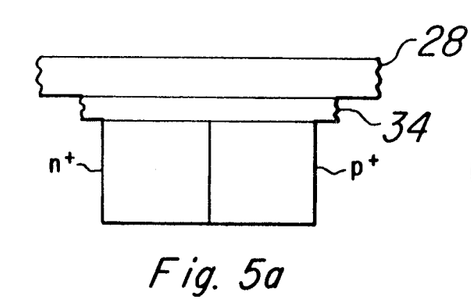
FIGS. 5a through 5d are front, top, left side and right side views respectively of the invention's capacitor structure.
Figure 5B:
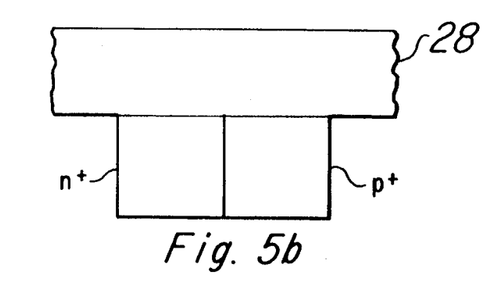
Figure 5C:
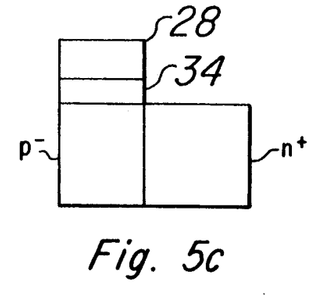
Figure 5D:
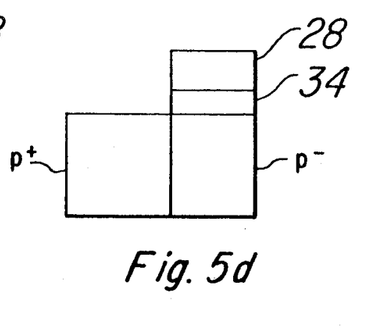

The structure of capacitors 24 and 26 is shown in FIGS. 5a, 5b, 5c, and 5d which illustrate front, top, left side and right side views respectively. Each capacitor 24, 26 of FIG. 4, as shown by FIGS. 5a a through 5d comprises capacitor gate 28 (preferably made of polycrystalline silicon), capacitor gate oxide 34 lying over lightly doped p-type region p−, heavily doped n-type source/drain region n+, and heavily doped p-type source/drain region p+ adjacent to the n+ source/drain region. Thus, the capacitors shown in FIG. 4 are MOS capacitors which can be formed by extension of a polysilicon gate over regions of a drain area. This requires no additional contact and, depending on the layout of a cell without the capacitor, can add some capacitance without any increase in cell size. For example, in an 18 micrometer by 24 micrometer cell with size determined by requirements of the metal levels; a capacitor of area of approximately 29.8 square micrometers was added without increase in cell size and without modification of the fabrication process. Additional capacitance area can be provided with increased cell area, with the increase in capacitance area approaching the increase in cell area.

In operation (with reference to FIGS. 5a through 5d), when a positive voltage is placed on gate 28, a capacitance develops by a strong inversion layer forming a n-type channel under gate 28 in to which electrons from region n+ diffuse. Likewise, when a negative voltage is placed on gate 28 a capacitance develops by an accumulation of holes forming a p-type channel into which holes from region p+ diffuse. This structure also solves the previously discussed problem of maintaining a capacitance level for sufficient SEU hardening.

Figure 6A:
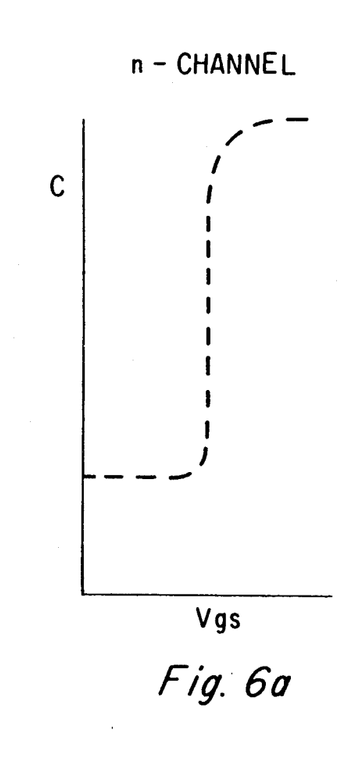
FIGS. 6a through 6c graphs showing variation in capacitance with variation in gate to source voltage.
Figure 6B:
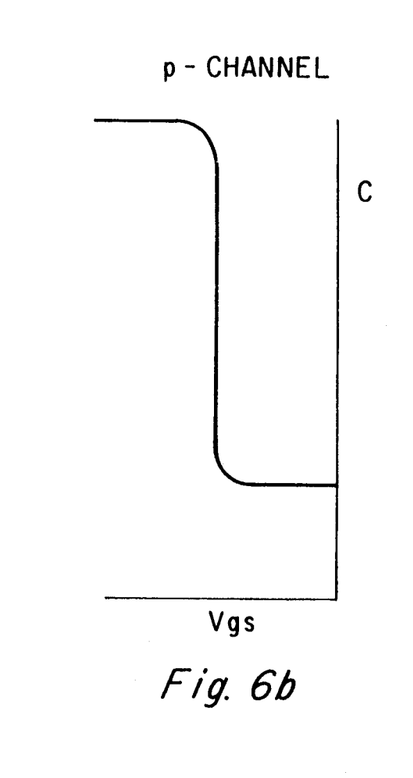
Figure 6C:
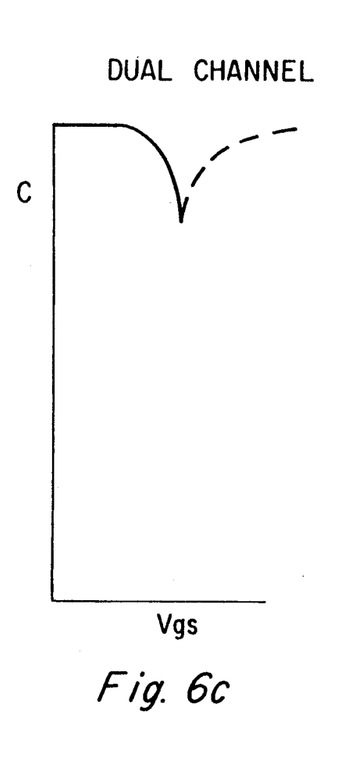

FIGS. 6a through 6c are graphs showing the variation in capacitance with the variation in gate to source voltage Vgs between gate 28 and region n+ and alternatively region p+ as shown in the drawings of FIGS. 5a through 5d. The capacitance variation represented in FIGS. 6a through 6c is primarily due to the formation of an accumulation layer or an inversion layer in the channel region of the MOS capacitor. Thus, as illustrated by FIG. 6a, the capacitance from the gate to an accumulation (n-type) layer side of the MOS capacitor is higher for larger positive values of Vgs (capacitor gate to source voltage) than for smaller values. Similarly, FIG. 6b shows that the capacitance to an inversion (p-type) layer side is higher for larger negative values of Vgs than for smaller negative values. FIG. 6c demonstrates that due to the dual channel contacted by the p+ and n+ regions (illustrated in FIGS. 5a through 5d) of capacitors 24, and 26, their capacitance is maintained at a relatively high value for both negative and positive gate voltages. Since the gate to source voltage will be either substantially positive or substantially negative for the two stable states of the memory cell, the dual channel contact gives a consistently large capacitance for a given area.

Figure 7A:
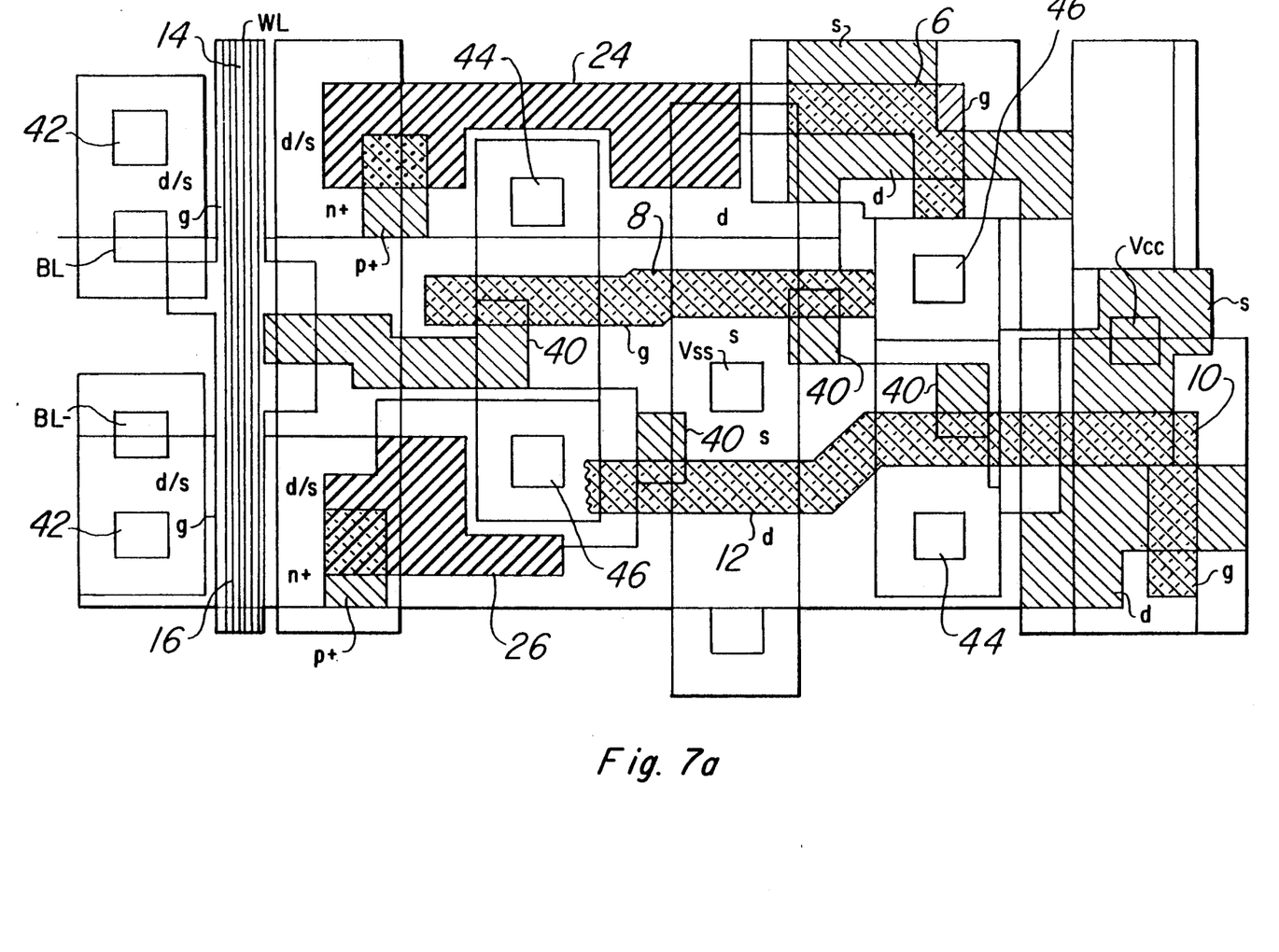
FIGS. 7a and 7b illustrate the superposition of a plurality of photolithographic masks showing the physical layout of the memory cell.

FIG. 7a illustrates the superposition of a plurality of portions of photolithographic masks so as to show the physical layout of memory cell 2 of FIG. 4 as well as the relative positions of elements within memory cell 2. The position of word line WL (shown at labeled vertical lines) indicates it serves as the gate of transistors 14 and 16. One drain/source d/s region of transistor 14 and 16 is connected at via contact region 42 by a metal or polycrystalline semiconductor material (i.e. silicon) to areas for respective bit lines BL and BL__. Diagonal lines represent the positions for p-type material regions. Gate (shown as triangular cross-hatched lines), drain and source regions for transistors 6, 8, 10, and 12 in FIG. 4 are labeled g, d and s respectively. The common drain of transistors 6 and 8 are connected at region 44 by metal or polycrystalline semiconductor to region 46 which is connected to the common gate of transistors 10 and 12. Likewise, the common drain of transistors 10 and 12 are connected at region 44 to region 46 which is connected to the common gate of transistors 6 and 8. Positions for contacts to Vcc and Vss are also indicated. Positions for capacitors 24 and 26 are indicated in the checkered regions with the location of capacitor n+ regions labeled n+ and capacitor p+ regions labeled p+. Positions 40 are indicated for p+ regions which help eliminate leakage due to gate sidewall channels.

Figure 7B:
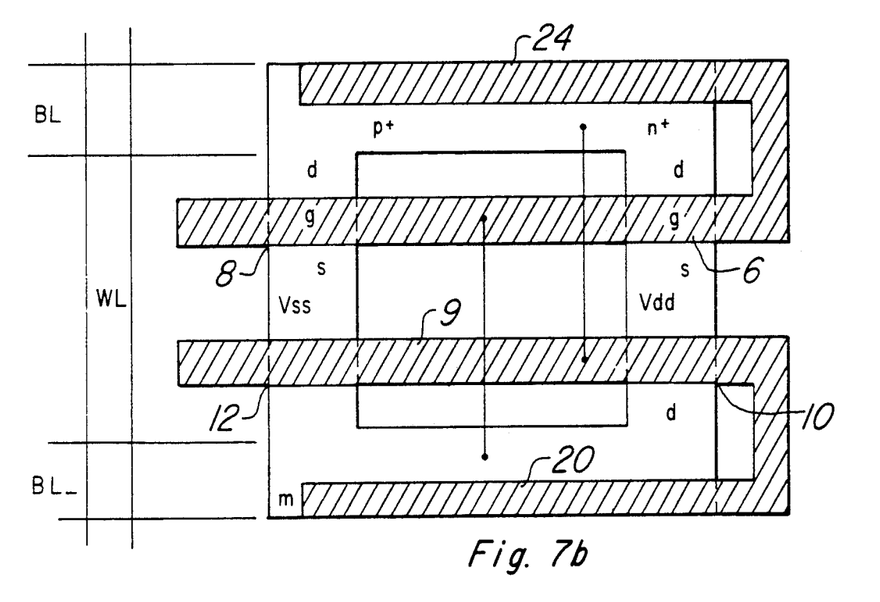
Figure 8A:
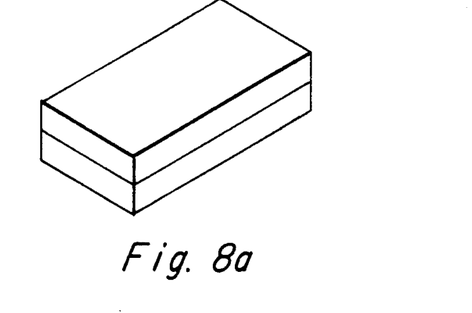
FIGS. 8a through 8e are three dimensional views of the capacitor structure during various stages of formation.
Figure 8B:
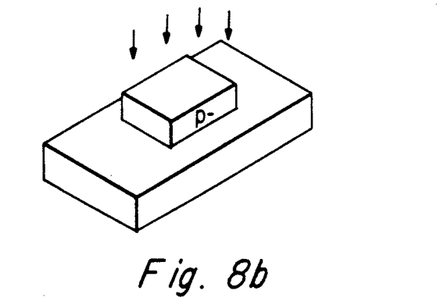
Figure 8C:
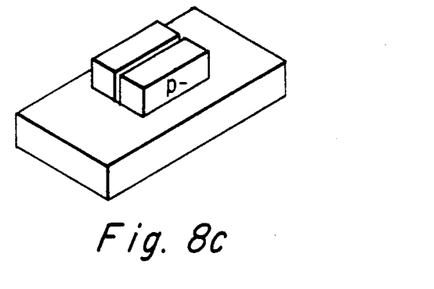
Figure 8D:
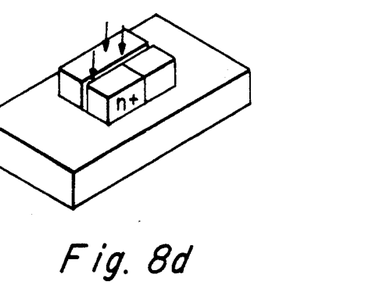
Figure 8E:
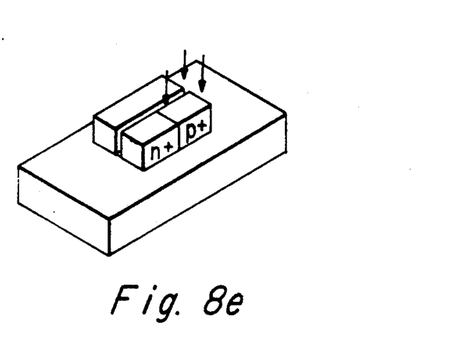

FIG. 7b illustrates a plurality of portions of photolithographic masks which help form the memory cell in moat region m. Here the common gate g (see cross-hatched area) of transistors 6 and 8 is shown extended to form capacitor 24 which comprises the common drain of inverter 4 and common gate g of inverter 4. Likewise, common gate g (see cross-hatched area) of transistors 10 and 12 are shown extended to form capacitor 26 which comprisises the common drain of inverter 5 and common gate g of inverter 5. A brief overview of a possible fabrication process for making capacitors 24 and 26, omitting annealing steps and other sundry details which will be apparent, after reading the following description, to those skilled in the art, shall be described with reference to FIGS. 8a through 8e which give three dimensional views of the capacitor structure during various stages of formation. Starting with a silicon 52 on insulator 54 (i.e. silicon dioxide) structure as shown in FIG. 8a, a mesa is etched as shown in FIG. 8b. A light acceptor e.g. boron, is now implanted (shown by arrows). Next an oxide layer 56 is grown. Polysilicon gate 58 is then deposited and patterned, followed by a heavy masked donor implant (see n+ region under implant indicating arrows) and then followed by a heavy masked acceptor implant (see p+ region under implant indicating arrows). Titanium is sputtered over the structure thus formed and sintered in a nitrogen ambient to form conductive titanium silicide over the n+ and p+ regions. The silicide over the n+ and p+ regions allow formation of a common node.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For example, n-type semiconductor regions may be substituted consistently throughout with p-type semiconductor regions and vice versa. It is contemplated that all such changes and additional embodiments are within the spirit and true scope of the invention as claimed below.

We claim:

1. A memory cell including a pair of cross-coupled inverters and further including a MOS capacitor connected across the cross-couplings of said pair of inverters, said MOS capacitor including a gate region, a channel region and a source region comprising both heavily doped n-type semiconductor material and heavily doped p-type semiconductor material connected to said channel region.

2. A memory cell as recited in claim 1 wherein said heavily doped n and p type semiconductor material of said MOS capacitor lie adjacent to one another.

3. A memory cell as recited in claim 1 wherein said adjacent heavily doped n and p type semiconductor material are connected together with silicide.

4. A memory cell as recited in claim 1 in which said gate region comprises a polycrystalline semiconductor region and said channel region comprises a lightly doped p-type semiconductor material and wherein said heavily doped n-type semiconductor material lies adjacent said heavily doped p-type semiconductor material and wherein said MOS capacitor further includes a gate oxide layer lying over said lightly doped p-type channel region.

5. A memory cell as recited in claim 4 wherein said adjacent semiconductor materials are connected by silicide.

6. A memory cell as recited in claim 1 in which said gate region comprises a polycrystalline semiconductor region and said channel region comprises a lightly doped n-type semiconductor material and wherein said heavily doped n-type semiconductor material lies adjacent said heavily doped p-type semiconductor material and wherein said MOS capacitor further includes a gate oxide layer lying over said lightly doped n-type channel region.

7. A memory cell as recited in claim 6 wherein said adjacent semiconductor materials are connected by silicide.

8. A memory cell as recited in claim 1 wherein said semiconductor material is silicon.

9. A memory cell as recited in claim 1 wherein said semiconductor material is gallium arsenide.

10. A memory cell as recited in claim 1 wherein said inverters include at least one field effect transistor.

11. A layout for the memory cell as recited in claim 10 wherein said MOS capacitor is formed by the extension of the gate of said at least one field effect transistor over the drain of said at least one transistor.

12. A layout for the memory cell as recited in claim 10 wherein said gate region of said MOS capacitor extends substantially along at least one dimension of said memory cell.

* * * * *